United States Patent
Zhou

(10) Patent No.: US 11,525,084 B2
(45) Date of Patent: Dec. 13, 2022

(54) II-II-VI ALLOY QUANTUM DOT, PREPARATION METHOD THEREFOR AND APPLICATION THEREOF

(71) Applicant: Najing Technology Corporation Limited, Zhejiang (CN)

(72) Inventor: Jianhai Zhou, Zhejiang (CN)

(73) Assignee: Najing Technology Corporation Limited, Zhejiang (CN)

( * ) Notice: Subject to any disclaimer, the term of this patent is extended or adjusted under 35 U.S.C. 154(b) by 147 days.

(21) Appl. No.: 17/042,216

(22) PCT Filed: Mar. 28, 2019

(86) PCT No.: PCT/CN2019/079974
§ 371 (c)(1),
(2) Date: Sep. 28, 2020

(87) PCT Pub. No.: WO2019/214358
PCT Pub. Date: Nov. 14, 2019

(65) Prior Publication Data
US 2021/0054274 A1    Feb. 25, 2021

(30) Foreign Application Priority Data

May 10, 2018  (CN) .......................... 201810444382.5
May 22, 2018  (CN) .......................... 201810495376.2

(51) Int. Cl.
| | |
|---|---|
| C09K 11/88 | (2006.01) |
| C01B 19/00 | (2006.01) |
| C01G 9/08 | (2006.01) |
| C01G 11/00 | (2006.01) |
| C09K 11/56 | (2006.01) |
| H01L 33/50 | (2010.01) |
| B82Y 20/00 | (2011.01) |
| B82Y 40/00 | (2011.01) |

(52) U.S. Cl.
CPC .......... *C09K 11/883* (2013.01); *C01B 19/007* (2013.01); *C01G 9/08* (2013.01); *C01G 11/006* (2013.01); *C09K 11/565* (2013.01); *H01L 33/502* (2013.01); *B82Y 20/00* (2013.01); *B82Y 40/00* (2013.01); *C01P 2004/64* (2013.01); *C01P 2004/84* (2013.01); *C01P 2006/60* (2013.01)

(58) Field of Classification Search
CPC ... C09K 11/883; C01B 9/007; C01P 2004/64; C01P 2004/84; B82Y 20/00; B82Y 40/00
See application file for complete search history.

(56) References Cited

U.S. PATENT DOCUMENTS 11,056,613 B2 *  7/2021  Prodanov ............... C09K 11/56

FOREIGN PATENT DOCUMENTS

| CN | 101875505 A | 11/2010 |
|---|---|---|
| CN | 104726085 A | 6/2015 |
| CN | 106479481 A | 3/2017 |
| CN | 106479482 A | 3/2017 |
| CN | 206194786 U | 5/2017 |
| CN | 107384368 A | 11/2017 |
| CN | 107384404 | * 11/2017 |
| CN | 108546553 A | 9/2018 |

OTHER PUBLICATIONS

Zhong et al., "A facile route to violet-to orange-emitting CdxZn1-xSe alloy nanocrsytals via cation exchange reaction", 2007, Nanotechnology 18 385606, pp. 1-6, Aug. 31, 2007.*
Xinhua Zhong, "A facile route to violet- to orange-emitting CdxZn1-xSe alloy nanocrystals via cation exchange reaction", Nanotechnology, vol. 18, Aug. 31, 2007, p. 385060-1-385060-6.

* cited by examiner

*Primary Examiner* — C Melissa Koslow
(74) *Attorney, Agent, or Firm* — Gang Yu

(57) ABSTRACT

The disclosure provides a II-II-VI alloy quantum dot, a preparation method and application thereof. The preparation method includes: step S1: reacting a precursor containing a second Group II element and a precursor containing a first Group VI element to form a II-VI semiconductor nanocluster; step S2: mixing the II-VI semiconductor nanocluster with a precursor containing a first Group II element, and performing cation exchange and in-situ growth to obtain a first system containing the II-II-VI alloy quantum dot.

20 Claims, 3 Drawing Sheets

II-II-VI ALLOY QUANTUM DOT, PREPARATION METHOD THEREFOR AND APPLICATION THEREOF

CROSS REFERENCE TO RELATED APPLICATIONS

This application is a national application of PCT/CN2019079974, filed on Mar. 28, 2019. The contents of PCT/CN2019079974 are all hereby incorporated by reference.

TECHNICAL FIELD

The disclosure relates to the field of quantum dot synthesis, in particular, to a II-II-VI alloy quantum dot, a preparation method therefore and application thereof.

BACKGROUND

Among all nanomaterials, solution-processed semiconductor nanocrystals (solution-processed quantum dots) with sizes within the range of quantum confinement effect have attracted much attention from the scientific circle and industry due to excellent optical properties such as high fluorescence quantum yield, wide absorption band, narrow emission peak, good chemical and optical stability and emission spectrum related to size and morphology, etc. As an excellent luminescent material, quantum dots have broad application prospects in the fields of solid-state lighting and display. Compared with the existing liquid crystal display technology, quantum dots have good solution processing performance with simpler operation, and the quantum dot light emitting diode has higher color resolution, lower energy consumption, and lower manufacturing cost.

Different from the energy level structure of quantum dots in traditional binary quantum dots (such as CdSe, CdS, etc.) that can only be controlled by adjusting the size and morphology, the energy level of alloy quantum dots can be adjusted by adjusting the proportion of components. Research results show that large-size core quantum dots have small quantum confinement effect, and the excitons of the core quantum dots is difficult to delocalize over the shell, thus covering thinner shell so as to isolate the influence of the environment on the excitonic state of the core quantum dots which is conducive to improving the environmental stability of the quantum dots (for example, improving the fluorescence photobleaching resistance of the quantum dots, etc.). In case of the same fluorescence emission peak wavelength of the cores, the size of alloy quantum dots can be larger than that of traditional binary quantum dots as quantum dot core. Therefore, the core-shell quantum dots using alloy quantum dots as the core can be more stable. For example, compared with CdSe quantum dots, at the same emission peak wavelength, CdZnSe quantum dots have a larger size.

At present, for the research of quantum dot light-emitting diodes, the quantum dots in the light-emitting layer are generally core-shell quantum dots, while the core parts of these core-shell quantum dots are mainly based on CdSe (mainly used for red and green light-emitting diodes), $Cd_xZn_{1-x}Se_yS_{1-y}$ (where $0 \leq x \leq 1$, $0 \leq y \leq 1$) quaternary alloy quantum dots (mainly used for green light-emitting diodes), $Cd_xZn_{1-x}S$ (where $0 \leq x \leq 1$) alloy quantum dots (mainly used for blue light-emitting diodes) and so on, according to reports in the literature. Due to the small size of CdSe quantum dots (approximately 2 nm) in the blue light emitting region, CdSe is extremely unstable when used for core-shell quantum dots, and the resulting core-shell quantum dots have poor monodispersity in size and morphology and wider full width at half maximum of fluorescence. In addition, CdSe has a large quantum confinement effect in the blue light emitting region, so it is difficult to realize blue core-shell quantum dots based on CdSe. In summary, CdZnSe alloy quantum dots can effectively solve the problem. Recently, Professor Li Linsong's group of Henan University recently obtained blue core-shell quantum dots with ZnS coating over CdZnSe alloy quantum dots, and the efficiency of light-emitting diode device thereof up to 16.2%.

In recent years, due to the optical and electrical properties related to the composition of CdZnSe alloy quantum dots, CdZnSe alloy quantum dots have received more and more attention in the fields of photovoltaic devices, photochemical battery devices, and the like. Compared with CdSe quantum dots, core-shell quantum dots have higher optical and chemical stability than pure core quantum dots. However, up to now, the core-shell quantum dots obtained based on CdZnSe alloy quantum dots have not been able to achieve narrow full width at half maximum of fluorescence and monodispersity in size and morphology, which is extremely unfavorable for the research of CdZnSe alloy quantum dots. The main reason is that the CdZnSe alloy quantum dots have not yet achieved narrow full width at half maximum of fluorescence and monodispersity in size and morphology despite of much effort made by many research groups. Obtaining quantum dots with monodispersity in size has always been one of the goals of quantum dots synthesis. However, for alloy quantum dots, in order to achieve narrow full width at half maximum of fluorescence, in addition to the requirement of monodispersity of size and morphology, the compositions need to be homogeneous. In other words, the ratio of components between each quantum dot should be about the same. Compared with the monodispersity in size and morphology, in alloy quantum dots, the composition homogeneity has a greater influence on the full width at half maximum of fluorescence of the quantum dots. There are four main methods for synthesizing CdZnSe alloy quantum dots reported in the literature:

The first one is to make a large-size ZnSe core, and then drop a cadmium precursor (usually cadmium carboxylate) to obtain CdZnSe alloy quantum dots by cation exchange, which is also the most commonly used method at present. Compared with CdSe quantum dots, the full width at half maximum of ZnSe quantum dots is narrower (about 13 nm). But despite of this, the fluorescence quantum yield of the alloy quantum dots obtained by this method is low, and the full width at half maximum is very wide (30~40 nm). With the addition of cadmium precursor, the cation exchange reaction rate becomes very fast, the full width at half maximum of fluorescence gradually widens, and the composition between Cd and Zn in the alloyed part of the quantum dots is not homogenous. Secondly, the extent to which cadmium can diffuse into ZnSe is limited, so that there is no way to achieve more sufficient alloying, and partial alloying ultimately only can make core-shell quantum dots like ZnSe/CdZnSe.

The second one is to mix a zinc precursor and a cadmium precursor, and inject the selenium precursor at a high temperature to directly perform alloying. But the alloy quantum dots obtained in this way have a full width at half maximum of fluorescence (30~50 nm) and are prone to self-nucleation. The main reason is that at high temperatures, the reactivity of cadmium precursor differs little from that of zinc precursor (in general, the activity of cadmium precursor is greater than that of zinc precursor, but at higher temperatures, it is difficult to distinguish between the reactivity of the two), resulting in non-homogenous composition for Cd and Zn of the CdZnSe core.

The third one is nucleation at low temperatures and growth at high temperatures. The synthesis method of blue CdZnSe alloy quantum dots recently reported by Professor Li Linsong of Henan University is nucleation at low temperatures and growth at high temperatures, which is essentially an improvement of the second method. At 300° C., the cadmium precursor was mixed with the zinc precursor, and injected into the Se-ODE solution of 220° C., which was subsequently heated to 280° C. for reaction. However, the full width at half maximum of fluorescence of the alloy quantum dots obtained by this method is relatively wider (about 40 nm) with easy occurrence of self-nucleation.

The fourth one is to make CdSe quantum dots, subsequently coat ZnSe shell at low temperatures and then alloy at elevated temperatures. Compared with the former three methods, this method has a more uniform size and morphology distribution, and a more homogenous composition, but with difficult alloying and low fluorescence quantum yield, and the degree of alloying being difficult to control. The alloying is insufficient, and partial alloying ultimately only can make core-shell quantum dots like CdSe/CdZnSe/ZnSe.

SUMMARY

The main purpose of the present disclosure is to provide a II-II-VI alloy quantum dot, a preparation method therefore and application thereof, in order to solve the problem of the wide full width at half maximum of fluorescence of CdZnSe alloy quantum dots in the prior art.

To achieve the aforesaid objectives, according to one aspect of the present disclosure, there is provided a preparation method of II-II-VI alloy quantum dot, including: step S1: reacting a precursor containing a second Group II element and a precursor containing a first Group VI element to form a II-VI semiconductor nanocluster; step S2: mixing the II-VI semiconductor nanocluster with a precursor containing a first Group II element, and performing cation exchange and in-situ growth to obtain a first system containing the II-II-VI alloy quantum dot.

Further, the size of the II-VI semiconductor nanocluster is 1 nm or less.

Further, the II-VI semiconductor nanocluster is one of ZnSe nanocluster, ZnS nanocluster, CdSe nanocluster and CdS nanocluster.

Further, the reaction temperature range of the step S1 is 150~310° C., and preferably, in the step S2, the temperature of the process of the mixing and the cation exchange is 150~310° C., and further preferably, in the step S2, the temperature range of the in-situ growth reaction is 200~310° C.

Further, a precursor of the first Group VI element is a selenium precursor, and preferably, the selenium precursor is one of a Se-ODE suspension, a Se-ODE solution, and an alkylphosphine selenium.

Further, a precursor of the second Group II element is a carboxylate, and preferably, a carboxylate group of the precursor of the second Group II element is a carboxylate group having a carbon chain length of 8 to 22.

Further, a precursor of the first Group II element is a carboxylate, and preferably, a carboxylate group of the precursor of the first Group II element is a carboxylate group having a carbon chain length of 1 to 22.

Further, changing a molar ratio of the second Group II element, the Group VI element and the first Group II element to change a fluorescence emission peak wavelength and a size of the II-II-VI alloy quantum dot.

Further, the step S2 including: mixing the II-VI semiconductor nanocluster with the precursor containing the first Group II element and an organic phosphine, and heating to perform cation exchange and in-situ growth for obtaining the II-II-VI alloy quantum dot.

Further, the organic phosphine is an alkylphosphine, and preferably an alkyl group in the alkylphosphine is an alkyl group having 2 to 10 carbon atoms.

Further, the preparation method further including step S3: mixing a precursor containing a second Group VI element with the first system, and heating to obtain a second system containing the II-II-VI alloy quantum dot with a II-VI shell.

Further, the temperature after heating in the step S3 is 250 to 320° C., and preferably, a molar ratio of the first Group II element with respect to the first Group VI element in the step S2 is less than or equal to 1.5:1, and the fluorescence emission peak wavelength of the obtained II-II-VI alloy quantum dot with the II-VI shell is 420~480 nm.

Further, the preparation method further including step S4: coating the II-II-VI alloy quantum dot with the II-VI shell to obtain a multi-shell coated II-II-VI alloy quantum dot.

According to another aspect of the present disclosure, there is provided a II-II-VI alloy quantum dot, wherein a full width at half maximum of the II-II-VI alloy quantum dot is between 14 and 26 nm, and preferably the II-II-VI alloy quantum dot is CdZnSc alloy quantum dot.

Further, the II-II-VI alloy quantum dot has a II-VI shell, and a full width at half maximum of the II-II-VI alloy quantum dot with the II-VI shell is between 14 and 22 nm, and preferably, the II-II-VI alloy quantum dot with the II-VI shell is CdZnSe/ZnSe alloy quantum dot.

Further, the II-II-VI alloy quantum dot with the II-VI shell is a multi-shell coated alloy quantum dot, and a quantum yield of the multi-shell coated alloy quantum dot is greater than or equal to 90%; preferably, the multi-shell coated II-II-VI alloy quantum dot is one of CdZnSe/ZnSe/ZnS, CdZnSe/ZnSe/CdZnS and CdZnSe/ZnSe/CdZnS/ZnS.

Further, the II-II-VI alloy quantum dot is prepared by any one of aforesaid preparation methods.

According to another aspect of the present disclosure, there is provided a device, the device being one of an optical device and an optoelectronic device, the device including a II-II-VI alloy quantum dot, wherein the II-II-VI alloy quantum dot is any one of the aforesaid II-II-VI alloy quantum dot.

A quantum dot composition, including a II-II-VI alloy quantum dot, wherein the II-II-VI alloy quantum dot is any one of the aforesaid II-II-VI alloy quantum dot.

Applying the technical scheme of the present disclosure, i.e., using the II-VI semiconductor nanoclusters formed in the early stage of nucleation as a substrate, and then adding the first Group II element precursor for cation exchange to form II-II-VI clusters, in accordance with the clusters, the growth of II-II-VI alloy quantum dots is carried out. Compared with traditional II-VI quantum dots, the II-VI nanoclusters formed in the early stage of nucleation are in the intermediate state between nanocrystalline nucleation and nanocrystalline growth, and the size is very small. At this time, the precursor containing the first Group II element is added for cation exchange, it may cause atoms of the first Group II element easily enter the innermost of the II-VI clusters, forming alloy-like II-II-VI nanoclusters, and then continue to grow. During the growth process, the atoms of the Group II element may gradually diffuse outwardly to the entire particle, so that the size and morphology of the particle respectively gradually become uniform, and the composition is gradually homogeneous, resulting in II-II-VI alloy quantum dots having a narrow full width at half maximum with homogeneous composition and more sufficient degree of alloying, and moreover, the self-nucleation phenomenon of II-VI quantum dots will not occur in the whole process.

BRIEF DESCRIPTION OF THE DRAWINGS

The accompanying drawings forming part of this application are used to provide a further understanding of the present disclosure. The illustrative embodiments of the present disclosure and descriptions thereof are used to explain the present disclosure and do not constitute an improper limitation of the present disclosure. In the drawings.

DETAILED DESCRIPTION

Figure 1:
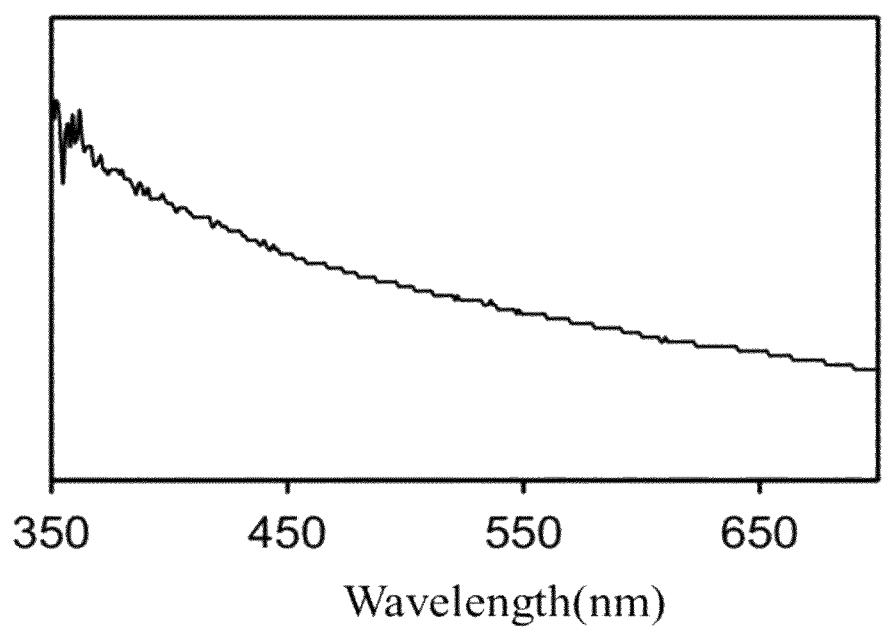
FIG. 1 shows the ultraviolet absorption spectrum of the system containing II-VI semiconductor nanoclusters according to Embodiment 1 of the present disclosure.

It should be noted that the embodiments of the present disclosure and the features of the embodiments may be combined with each other in case of no conflict. The disclosure will be described in detail below with reference to the figures and in conjunction with the embodiments.

As used herein, the singular forms "a", "an" and "the" are intended to include the plural forms as well, unless the context clearly indicates otherwise.

It should be noted that the core and the shell may have an interface, and an element of at least one of the core or the shell in the interface may have a concentration gradient wherein the concentration of the element(s) of the shell decreases toward the core. The shell and the adjacent shell may have an interface, and the interface may include an element of at least one of the two shells.

"ODE" means 1-Octadecene.

As analyzed by the background of the present application, the CdZnSe alloy quantum dots obtained in the prior art have a wider full width at half maximum of fluorescence, resulting in a low quantum yield. In order to solve this problem, the present application provides a II-II-VI alloy quantum dot, a preparation method and application thereof.

According to the energy level distribution of quantum dots, the core-shell structure formed by CdSe quantum dots and ZnSe quantum dots is a type I structure, that is, the conduction band of CdSe quantum dots is lower than that of ZnSe, while the valence band of CdSe is higher than that of ZnSe. The valence band and conduction band of the alloy formed by CdSe and ZnSe should be between those of the two. To form completely alloyed quantum dots instead of a similar core-shell structure, it is better to start from the early stage of nucleation when form a relatively complete alloying. Although the aforesaid second method has been able to obtain highly alloyed CdZnSe alloy quantum dots, the size and morphology are not uniform, and the composition of the quantum dots is not uniform. This requires a different approach, accordingly, in an exemplary embodiment of the present application, a preparation method of II-II-VI alloy quantum dot is provided, including: step S1: reacting a precursor containing a second Group II element and a precursor containing a first Group VI element to form a II-VI semiconductor nanoclusters; step S2: mixing the II-VI semiconductor nanocluster with a precursor containing a first Group II element, and performing cation exchange and in-situ growth to obtain a first system containing the II-II-VI alloy quantum dot.

In this application, the II-VI semiconductor nanoclusters formed in the early stage of nucleation are used as the substrate, and then the first Group II element precursor is added for cation exchange to form II-II-VI clusters. Based on this, the growth of II-II-VI alloy quantum dots is carried out. Compared with traditional II-VI quantum dots, the II-VI nanoclusters formed in the early stage of nucleation are in the intermediate state between nanocrystalline nucleation and growth, and the size is very small. At this time, the precursor containing the first Group II element is added for cation exchange, it may cause atoms of the first Group II element easily enter the innermost of the II-VI clusters, forming alloy-like II-II-VI nanoclusters, and then continue to grow. During the growth process, the atoms of the Group II element gradually may diffuse outwardly to the entire particle, so that the size and morphology of the particles respectively gradually become uniform, and the composition is gradually homogeneous, resulting in the II-II-VI alloy quantum dots having a narrow full width at half maximum with homogeneous composition and more sufficient alloying, and moreover, the self-nucleation phenomenon of II-VI quantum dots will not occur in the whole process.

In some embodiments, in order to ensure the cation exchange process of the atoms of the first Group II element more stably, the size of the aforesaid II-VI semiconductor nanoclusters is preferably 1 nm or less.

In one or more embodiments of the present application, the aforesaid II-VI semiconductor nanoclusters are one of ZnSe nanoclusters, ZnS nanoclusters, CdSe nanoclusters and CdS nanoclusters. In order to better control the size of the obtained II-VI semiconductor nanoclusters, in some embodiments, the reaction temperature range of the aforesaid step S1 is 150~310° C., and the reaction temperature can be kept unchanged.

In addition, in the process of mixing II-VI semiconductor nanoclusters with the precursor containing the first Group II element and the cation exchange process, the temperature of the system is controlled to regulate the speed of cation exchange and further affect the size of the resulting II-II-VI alloy quantum dots, and in some embodiments, in step S2, the temperature of the process of mixing the II-VI semiconductor nanoclusters with the precursor of the first Group II element and the cation exchange process is 150~310'C, while the two temperatures may be selected to remain unchanged, the temperature of the two processes may also be consistent. Since cation exchange is easier than in-situ growth reaction, after sufficient cation exchange is completed, in-situ growth is carried out by raising the temperature. In some embodiments, in step S2, the reaction temperature range for in-situ growth is 200~310° C., preferably 250~310° C.

The Group VI element used in the present application may be various. In some embodiments, the aforesaid precursor of the first Group VI element is a selenium precursor. In some embodiments, the selenium precursor is one of a Se-ODE suspension, a Se-ODE solution, and an alkylphosphine selenium. The aforesaid selenium precursors will have different reactivity due to the different dispersion media of selenium.

In some embodiments, the aforesaid precursor of the second Group II element is a carboxylate, and the carboxylate group of the precursor of the second Group II element is preferably but not limited to a carboxylate group having a carbon chain length of 8 to 22, with good availability of raw materials and good reactivity. In some embodiments, the aforesaid precursor of the first Group II element is a carboxylate, and the carboxylate group of the precursor of the first Group II element is preferably but not limited to a carboxylate group having a carbon chain length of 1 to 22, with good availability of raw materials and have good reactivity.

During the test, the inventors of the present application found that by changing the ratio of elements in the II-II-VI alloy quantum dots, the size of the resulting quantum dots can be changed, and further the fluorescence emission peak position can be changed, that is, changing the molar ratio of the second Group II element, Group VI element and the first Group II element changes the fluorescence emission peak wavelength and the size of the II-II-VI alloy quantum dots. It should be noted that for alloy quantum dots, neither the ratio of precursor elements nor the size of the quantum dots has a one-to-one correspondence with the fluorescence emission peak wavelength of the quantum dots. In the case of different ratio of precursor elements, the fluorescence emission peak position can also be the same by adjusting the size of the synthesized quantum dots.

In some embodiments, on the one hand, in order to improve the fluorescence quantum yield, on the other hand, when the selenium precursor is a selenium precursor other than alkylphosphine selenium, in order to dissolve the free elemental selenium precursor, reduce the reaction rate, inhibit the self-nucleation during the growth at an elevated temperature, and improve the quantum yield of II-II-VI alloy quantum dots, the aforesaid step S2 includes: mixing the II-VI semiconductor nanocluster with the precursor containing the first Group II element and an organic phosphine, and heating to perform cation exchange and in-situ growth for obtaining the II-II-VI alloy quantum dot.

In some embodiments, the aforesaid organic phosphine is an alkylphosphine, and the alkyl group in the alkylphosphine is preferably but not limited to an alkyl group having 2 to 10 carbon atoms.

In one or more embodiments of the present application, the aforesaid preparation method further includes step S3: mixing the precursor containing the second Group VI element with the first system, and heating to obtain a second system containing the II-II-VI alloy quantum dot with a II-VI shell. The II-II-VI alloy quantum dots obtained in step S2 are coated by the shell to further improve the environmental stability of II-II-VI alloy quantum dots. In some embodiments, the aforesaid precursor of the second Group VI element is the same as the precursor of the first Group VI element in step S1, for example, preferably but not limited to selenium precursor. In some embodiments, the selenium precursor is Se-ODE suspension, Se-ODE solution or alkylphosphine selenium or a mixture thereof.

Taking selenium as the Group VI element as well as zinc and cadmium as the Group II element as an example, in the aforesaid step S3, the coating speed of different selenium precursors is different, for example, the coating speed of the Se-ODE suspension is greater than that of the Se-ODE solution, which is higher than the coating speed of alkylphosphine selenium, making the coating speed of the ZnSe shell different. If the coating of the ZnSe shell is too slow, then the Cd atoms may continue to diffuse outward, resulting in a continuous red-shift in peak position, and until the end of the reaction, the formed alloy quantum dots with the ZnSe shell have a larger core and a thinner shell; if the coating speed of the ZnSe shell is very fast at first, then the restraint of the ZnSe shell causes the Cd atoms to cease diffusion after diffusing to a certain degree, so that the formed CdZnSe alloy quantum dots have a smaller size of core, a thicker shell, and a smaller fluorescence emission peak wavelength. After the step S3, at any one of the aforesaid diffusion speeds, the alloy quantum dots with the same size but different core sizes can be finally obtained, so that the final fluorescence emission peak wavelength of the quantum dots is different. Therefore, adjusting the type and concentration of the precursor of the second Group VI element can affect the coating speed and further adjust the final fluorescence emission peak wavelength to a different position. The foregoing method is completely different from the traditional method of adjusting the fluorescence emission peak wavelength by adjusting the size of quantum dots.

In order to improve the crystallizability of the quantum dots and prevent self-nucleation, in some embodiments, the temperature after heating in the step S3 is 250 to 320° C. In order to adjust the fluorescence emission peak wavelength, in some embodiments, the molar ratio of the first Group II element with respect to the first Group VI element in step S2 is less than or equal to 1.5:1, and the fluorescence peak wavelength of the obtained II-II-VI alloy quantum dot with the II-VI shell is 420~480 nm. By adjusting the molar ratio within the foregoing 1.5:1, the size of the core can be changed from 2 nm to 5 nm.

In some embodiments, the aforesaid preparation method further includes step S4: coating the II-II-VI alloy quantum dot with the II-VI shell to obtain a multi-shell coated II-II-VI alloy quantum dot. The composition of each shell can vary according to the change of the raw materials. Refer to the shell coating method commonly used in the prior art as the specific coating method, that is, the specific shell element growth is carried out after purification, which will not be repeated here. Coating multiple shells can further improve the stability of quantum dots.

In yet another exemplary embodiment of the present application, there is provided a II-II-VI alloy quantum dot, and the full width at half maximum of fluorescence the II-II-VI alloy quantum dot is between 14 and 26 nm. In one or more embodiments, the full width at half maximum of fluorescence is between 14 and 25 nm. The full width at half maximum of fluorescence of the II-II-VI alloy quantum dots of the present application is narrower, with more uniform size and morphology distribution, thereby achieving a higher external quantum efficiency. The aforesaid II-II-VI alloy quantum dot is preferably but not limited to CdZnSe alloy quantum dot. The aforesaid II-II-VI alloy quantum dot can be prepared by the preparation method of the present application.

In order to further improve the environmental stability of the aforesaid II-II-VI alloy quantum dot, in some embodiments, the aforesaid II-II-VI alloy quantum dot has a II-VI shell, and the full width at half maximum of fluorescence of the II-II-VI alloy quantum dot with the II-VI shell is between 14 and 22 nm. In one or more embodiments, the full width at half maximum of fluorescence is between 14 and 20 nm. The aforesaid II-II-VI alloy quantum dot with the II-VI shell is preferably but not limited to CdZnSe/ZnSe alloy quantum dot. Thus, the II-II-VI alloy quantum dot of the present application has good application performance.

There may be one or more layers of the aforesaid II-VI shell. In some embodiments, the II-II-VI alloy quantum dot with the II-VI shell is a multi-shell coated alloy quantum dot, and the quantum yield of the multi-shell coated alloy quantum dot is greater than or equal to 90%. In some embodiments, the multi-shell coated II-II-VI alloy quantum dot is one of CdZnSe/ZnSe/ZnS, CdZnSe/ZnSe/CdZnS and CdZnSe/ZnSe/CdZnS/ZnS.

In addition, the present application also provides an optical device, a quantum dot composition, and an optoelectronic device, including a II-II-VI alloy quantum dot, the II-II-VI alloy quantum dot is the aforesaid II-II-VI alloy quantum dot. The aforesaid optical device may be used for a quantum dot film, a quantum dot tube, a quantum dot color film, and the combination thereof with an LED. Since the II-II-VI alloy quantum dots of the present application have a small full width at half maximum of fluorescence, the fluorescence quantum yield is high, and the luminous efficiency of the optical device having the same is also high.

The aforesaid quantum dot composition may be quantum dot ink or quantum dot glue, and the components of the composition may be adjusted according to specific applications.

The aforesaid optoelectronic device may be a solar cell, an electroluminescent device, a single photon light source and so on.

The beneficial effects of the present application will be further described below in conjunction with embodiments and comparative embodiments.

Preparation of Reaction Precursors:

Preparation of 0.5 mmol/mL selenium powder suspension (Se-SUS): Disperse selenium powder (0.4 g, 5 mmol, 100 mesh or 200 mesh) into 10 mL ODE, and prepare 0.5 mmol/mL suspension by ultrasonic for 5 minutes. The preparation of selenium powder suspension of other concentrations is similar to this, with only changing the amount of selenium powder. Shake well by hand before use.

Preparation of 0.2 mmol/mL cadmium oleate solution: Weigh 0.2560 g cadmium oxide (CdO), 5 mmol oleic acid, and 10 mL ODE to place in a three-necked flask, vent the air with inert gas for 10 minutes, and raise the temperature to 280° C. to obtain a clarified solution and then stop the reaction for future use.

Preparation of 2 mmol/mL Se-TBP solution: Weigh 0.64 g Se, place it in a 20 mL glass bottle with rubber stopper and keep the bottle sealed, and vent the air with inert gas. 10 mL of TBP was injected, and the mixture was repeatedly oscillated by ultrasonic until S was fully dissolved.

Preparation of 0.2 mmol/mL S-TBP solution: Take 1 mL 2 mmol/mL S-TBP solution, 9 mL ODE was added and mixed well.

Embodiment 1

Synthesis of $Cd_xZn_{1-x}Se$ alloy quantum dots: Weigh basic zinc carbonate (0.22 g, 0.4 mmol), oleic acid (1.4 g, 0.5 mmol) and 12 mL ODE to place in a 100 mL three-necked flask, vent the air with inert gas for 10 minutes and then raise the temperature to 280° C. to obtain a clarified solution (ie, a precursor containing a second Group II element). After cooling the clarified solution to 180'C, 1 mL of 0.5 mmol/mL Se-ODE suspension was injected into it, and a system containing II-VI semiconductor nanoclusters was formed after 10 minutes of reaction. Subsequently, 0.5 ml, of 0.2 mmol/mL cadmium olcate solution (i.e., a precursor containing a first Group II element) was injected into the aforesaid system, and a first system containing $Cd_xZn_{1-x}Se$ alloy quantum dots was obtained after 10 minutes of reaction. Inject 1 mL of TBP solution into the first system, raise the temperature to 300° C., and continue the reaction for 60 min.

Figure 2:
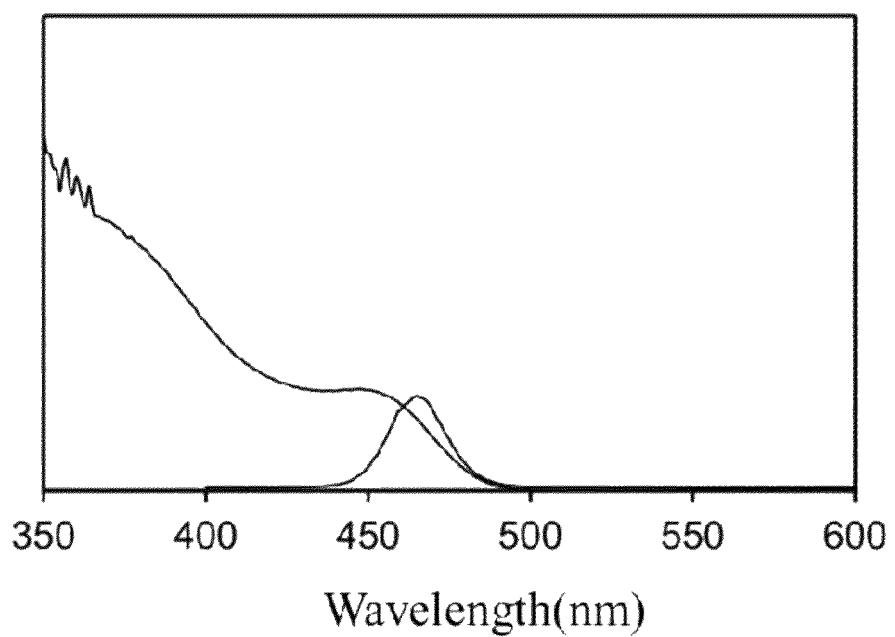
FIG. 2 shows the ultraviolet-visible absorption spectroscopy and the fluorescence spectroscopy of $Cd_xZn_{1-x}Se$ alloy quantum dots according to Embodiment 1 of the present disclosure.

In the reaction process, a certain amount of reaction solution was taken and injected into a quartz cuvette containing 1~2 mL of toluene for the ultraviolet-visible absorption spectroscopy and fluorescence spectroscopy. Among them, the ultraviolet absorption peak spectrum of the system containing II-VI semiconductor nanoclusters is shown in FIG. 1, where there is no obvious absorption peak in the spectrum of FIG. 1, mainly because the particle size is too small, and it is in the initial stage of the reaction (According to the reaction conditions, the reaction time at low temperature or high temperature, it can also be inferred that it is impossible to grow ZnSe with large grain size); secondly, the corresponding wavelength is less than 400 nm when the value of absorption intensity becomes obvious rising (According to the quantum confinement effect, the size is very small. The value of absorption intensity rising obviously after the wavelength of 400 nm may be caused by scattering), so it indicates the formation of nanoclusters. The fluorescence ultraviolet spectrum of the resulting $Cd_xZn_{1-x}Se$ alloy quantum dots is shown in FIG. 2.

Embodiment 2

Figure 4:
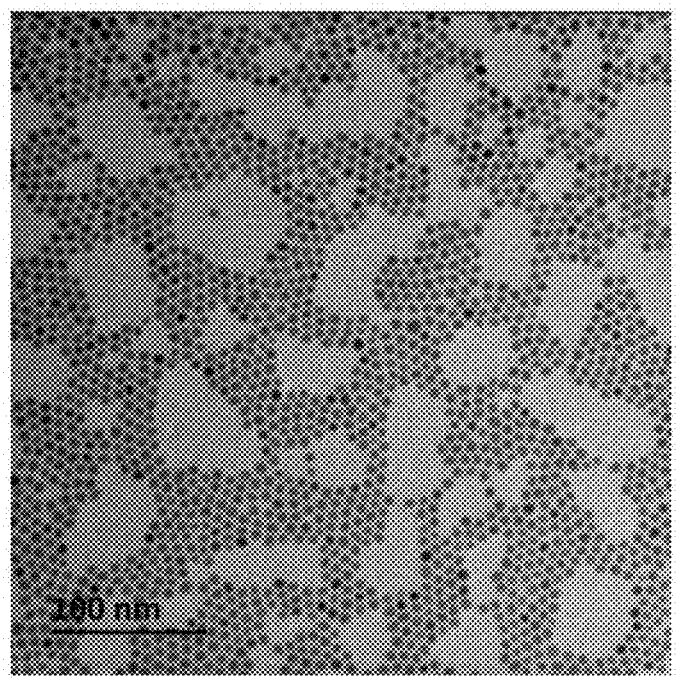
FIG. 4 shows the transmission electron microscopy of $Cd_xZn_{1-x}Se$ alloy quantum dots according to Embodiment 2 of the present disclosure.

Synthesis of $Cd_xZn_{1-x}Se$ alloy quantum dots: Weigh basic zine carbonate (0.22 g, 0.4 mmol), oleic acid (1.4 g, 0.5 mmol) and 12 mL ODE to place in a 100 mL three-necked flask, vent the air with inert gas for 10 minutes and then raise the temperature to 280° C. to obtain a clarified solution. After cooling the clarified solution to 150° C., 1 mL of 0.5 mmol/mL Se-ODE suspension was injected, and a system containing II-VI semiconductor nanoclusters was formed after 10 minutes of reaction. Subsequently, 0.5 mL of 0.2 mmol/mL cadmium oleate solution was injected into the aforesaid system, and a first system containing $Cd_xZn_{1-x}Se$ alloy quantum dots was obtained after 10 minutes of reaction. Inject 1 mL of TBP solution into the first system, raise the temperature to 300° C., and continue the reaction for 60 min. In the reaction process, a certain amount of reaction solution was taken and injected into a quartz cuvette containing 1~2 mL of toluene for the ultraviolet-visible absorption spectroscopy and fluorescence spectroscopy. In addition, TEM was used to detect the morphology and size of the obtained alloy quantum dots, and the detection results are shown in FIG. 4.

Embodiment 3

Synthesis of $Cd_xZn_{1-x}Se$ alloy quantum dots: Weigh basic zinc carbonate (0.22 g, 0.4 mmol), oleic acid (1.4 g, 0.5 mmol) and 12 mL ODE to place in a 100 mL three-necked flask, vent the air with inert gas for 10 minutes and then raise the temperature to 310° C. to obtain a clarified solution. After cooling the clarified solution to 180° C., 1 mL of 0.5 mmol/mL Se-ODE suspension was injected, and a system containing II-VI semiconductor nanoclusters was formed after 10 minutes of reaction. Subsequently, 0.5 mL of 0.2 mmol/mL cadmium oleate solution was injected into the aforesaid system, and a first system containing $Cd_xZn_{1-x}Se$ alloy quantum dots was obtained after 10 minutes of reaction. Inject 1 mL of TBP solution into the first system, raise the temperature to 310° C., and continue the reaction for 60 min. In the reaction process, a certain amount of reaction solution was taken and injected into a quartz cuvette containing 1~2 mL of toluene for the ultraviolet-visible absorption spectroscopy and fluorescence spectroscopy.

Embodiment 4

Synthesis of $Cd_xZn_{1-x}Se$ alloy quantum dots: Weigh basic zinc carbonate (0.22 g, 0.4 mmol), oleic acid (1.4 g, 0.5 mmol) and 12 mL ODE to place in a 100 mL three-necked flask, vent the air with inert gas for 10 minutes and then raise the temperature to 280° C. to obtain a clarified solution. After cooling the clarified solution to 180° C., 2 mL of 0.5 mmol/mL Se-ODE suspension was injected into it, and a system containing II-VI semiconductor nanoclusters was formed after 10 minutes of reaction. Subsequently, 0.5 mL of 0.2 mmol/ml, cadmium oleate solution was injected into the aforesaid system, and a first system containing $Cd_xZn_{1-x}Se$ alloy quantum dots was obtained after 10 minutes of reaction. Inject 1 mL of TBP solution into the first system, raise the temperature to 300° C., and continue the reaction for 60 min. In the reaction process, a certain amount of reaction solution was taken and injected into a quartz cuvette containing 1~2 mL of toluene for the ultraviolet-visible absorption spectroscopy and fluorescence spectroscopy.

Embodiment 5

Synthesis of $Cd_xZn_{1-x}Se$ alloy quantum dots: Weigh basic zinc carbonate (0.22 g, 0.4 mmol), oleic acid (1.4 g, 0.5 mmol) and 12 mL ODE to place in a 100 mL three-necked flask, vent the air with inert gas for 10 minutes and then raise the temperature to 280° C. to obtain a clarified solution. After cooling the clarified solution to 180° C., 1 mL of 0.5 mmol/mL Se-ODE suspension was injected, and a system containing II-VI semiconductor nanoclusters was formed after 10 minutes of reaction. Subsequently, 1 ml of 0.2 mmol/mL cadmium oleate solution was injected into the aforesaid system, and a first system containing $Cd_xZn_{1-x}Se$ alloy quantum dots was obtained after 10 minutes of reaction. Inject 1 mL of TBP solution into the first system, raise the temperature to 300° C., and continue the reaction for 60 min. In the reaction process, a certain amount of reaction solution was taken and injected into a quartz cuvette containing 1~2 mL of toluene for the ultraviolet-visible absorption spectroscopy and fluorescence spectroscopy.

Embodiment 6

Synthesis of $Cd_xZn_{1-x}Se$ alloy quantum dots: Weigh zinc acetate (0.368 g, 2 mmol), oleic acid (1.4 g, 0.5 mmol) and 12 mL ODE to place in a 100 mL three-necked flask, vent the air with inert gas for 10 minutes and then raise the temperature to 280° C. to obtain a clarified solution. After cooling the clarified solution to 180° C., 1 mL of 0.5 mmol/mL Se-ODE suspension was injected, and a system containing II-VI semiconductor nanoclusters was formed after 10 minutes of reaction. Subsequently, 0.5 mL of 0.2 mmol/mL cadmium oleate solution was injected into the aforesaid system, and a first system containing $Cd_xZn_{1-x}Se$ alloy quantum dots was obtained after 10 minutes of reaction. Inject 1 mL of TBP solution into the first system, raise the temperature to 300° C., and continue the reaction for 60 min. In the reaction process, a certain amount of reaction solution was taken and injected into a quartz cuvette containing 1~2 mL of toluene for the ultraviolet-visible absorption spectroscopy and fluorescence spectroscopy.

Embodiment 7

Synthesis of v alloy quantum dots: Weigh basic zinc carbonate (0.22 g, 0.4 mmol), oleic acid (1.4 g, 0.5 mmol) and 10 mL ODE to place in a 100 mL three-necked flask, vent the air with inert gas for 10 minutes and then raise the temperature to 280° C. to obtain a clarified solution. After cooling the clarified solution to 180° C., 1 mL of 0.5 mmol/mL S-ODE suspension was injected, and a system containing II-VI semiconductor nanoclusters was formed after 10 minutes of reaction. Subsequently, 0.5 mL of 0.2 mmol/mL cadmium oleate solution was injected into the aforesaid system, and a first system containing $Cd_xZn_{1-x}Se$ alloy quantum dots was obtained after 10 minutes of reaction. Inject 1 mL of TBP solution into the first system, raise the temperature to 300° C., and continue the reaction for 60 min. In the reaction process, a certain amount of reaction solution was taken and injected into a quartz cuvette containing 1~2 mL of toluene for the ultraviolet-visible absorption spectroscopy and fluorescence spectroscopy.

Embodiment 8

Figure 3:
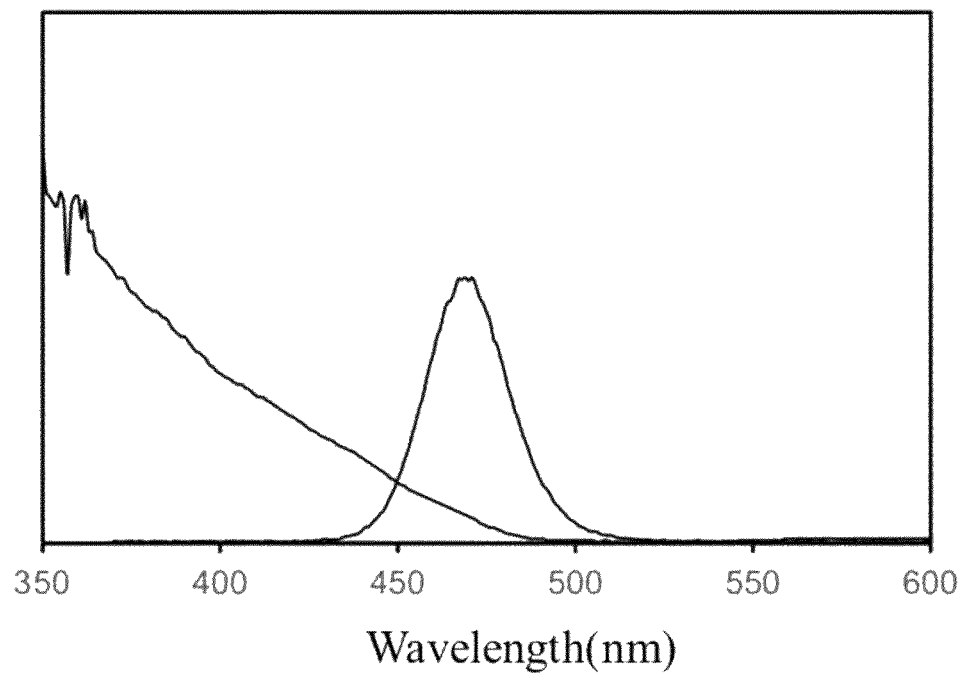
FIG. 3 shows the ultraviolet-visible absorption spectroscopy and the fluorescence spectroscopy of $Cd_xZn_{1-x}Se/ZnSe$ core-shell quantum dots according to Embodiment 8 of the present disclosure.

Synthesis of $Cd_xZn_{1-x}Se/ZnSe$ core-shell quantum dots: Weigh basic zinc carbonate (0.33 g, 0.6 mmol), oleic acid (2.1 g, 0.75 mmol) and 10 mL ODE in a 100 mL three-necked flask, vent the air with inert gas for 10 minutes and then raise the temperature to 280° C. to obtain a clarified solution. After cooling the clarified solution to 180° C., 1 mL of 0.5 mmol/mL Se-ODE suspension was injected into it, then continue to react for 10 minutes. Subsequently, 2 mL of 0.2 mmol/mL cadmium oleate solution was injected into it, then continue to react for 10 minutes, followed by injection of 1 mL of 0.5 mmol/mL Se-ODE suspension, then continue to react for 10 minutes. Then, add 0.5 mL of 2 mmol/mL Se-TBP, raise the temperature to 310° C. and continue the reaction for 60 min to obtain a product system. In the reaction process, a certain amount of reaction solution was taken and injected into a quartz cuvette containing 1~2 mL of toluene for the ultraviolet-visible absorption spectroscopy and fluorescence spectroscopy. The detection results are shown in FIG. 3.

Embodiment 9

Figure 5:
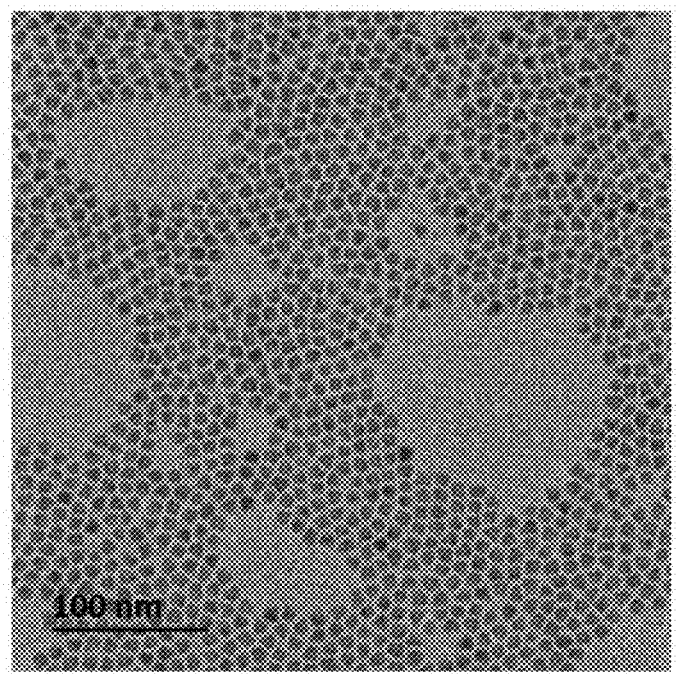
FIG. 5 shows the transmission electron microscopy of $Cd_xZn_{1-x}Se/ZnSe$ core-shell quantum dots according to Embodiment 9 of the present disclosure.

Synthesis of $Cd_xZn_{1-x}Se/ZnSe$ core-shell quantum dots: Weigh basic zinc carbonate (0.33 g, 0.6 mmol), oleic acid (2.1 g, 0.75 mmol) and 10 mL ODE to place in a 100 mL three-necked flask, vent the air with inert gas for 10 minutes and then raise the temperature to 280° C. to obtain a clarified solution. After cooling the clarified solution to 180° C., 1 mL of 0.5 mmol/mL Se-ODE suspension was injected into it, then continue to react for 10 minutes. Subsequently, 2 mL of 0.2 mmol/mL cadmium oleate solution was injected into it, then continue to react for 10 minutes, followed by injection of 1 mL of 0.5 mmol/mL Se-ODE suspension, then continue to react for 10 minutes. Then, add 0.5 mL of 2 mmol/mL Se-TBP and raise the temperature to 310° C., continue to react for 30 minutes, and continue the reaction for 30 min after adding 0.5 mL of 2 mmol/mL Se-TBP to obtain a product system. In the reaction process, a certain amount of reaction solution was taken and injected into a quartz cuvette containing 1~2 mL of toluene for the ultraviolet-visible absorption spectroscopy and fluorescence spectroscopy. In addition, TEM was used to detect the morphology and size of the obtained alloy quantum dots, and the detection results were shown in FIG. 5.

Embodiment 10

Synthesis of $Cd_xZn_{1-x}Se/ZnSe$ core-shell quantum dots: Weigh basic zinc carbonate (0.33 g, 0.6 mmol), oleic acid (2.1 g, 0.75 mmol) and 10 mL ODE to place in a 100 mL three-necked flask, vent the air with inert gas for 10 minutes and then raise the temperature to 280'C to obtain a clarified solution. After cooling the clarified solution to 180° C., 1 mL of 0.5 mmol/mL Se-ODE suspension was injected into it, then continue to react for 10 minutes. Subsequently, 1 mL of 0.2 mmol/mL cadmium oleate solution was injected into it, then continue to react for 10 minutes, followed by injection of 1 mL of 0.5 mmol/mL Se-ODE suspension, then continue to react for 10 minutes. Then, add 0.5 mL of 2 mmol/mL Se-TBP and raise the temperature to 310° C., and continue the reaction for 60 min to obtain a product system. In the reaction process, a certain amount of reaction solution was taken and injected into a quartz cuvette containing 1~2 ml, of toluene for the ultraviolet-visible absorption spectroscopy and fluorescence spectroscopy.

Embodiment 11

Synthesis of $Cd_xZn_{1-x}Se/ZnSe$ core-shell quantum dots: Weigh basic zinc carbonate (0.33 g, 0.6 mmol), oleic acid (2.1 g, 0.75 mmol) and 10 mL ODE to place in a 100 mL three-necked flask, vent the air with inert gas for 10 minutes and then raise the temperature to 280° C. to obtain a clarified solution. After cooling the clarified solution to 180° C., 1.5 mL of 0.5 mmol/mL Se-ODE suspension was injected into it, then continue to react for 10 minutes. Subsequently, 2 mL of 0.2 mmol/mL cadmium oleate solution was injected into it, then continue to react for 10 minutes, followed by injection of 1 mL of 0.5 mmol/mL Se-ODE suspension, then continue to react for 10 minutes. Then, add 0.5 mL of 2 mmol/mL Se-TBP and raise the temperature to 310° C., and continue the reaction for 60 min to obtain a product system. In the reaction process, a certain amount of reaction solution was taken and injected into a quartz cuvette containing 1~2 mL of toluene for the ultraviolet-visible absorption spectroscopy and fluorescence spectroscopy.

Embodiment 12

Synthesis of $Cd_xZn_{1-x}Se$ alloy quantum dots: Weigh basic zinc carbonate (0.22 g, 0.4 mmol), oleic acid (1.4 g, 0.5 mmol) and 12 mL ODE to place in a 100 mL three-necked flask, vent the air with inert gas for 10 minutes and then raise the temperature to 280° C. to obtain a clarified solution. After heating the clarified solution to 310° C., 1 mL of 0.5 mmol/mL Se-ODE suspension was injected into it, and a system containing II-VI semiconductor nanoclusters was formed after 10 seconds of reaction. Subsequently, 0.5 mL of 0.2 mmol/mL cadmium oleate solution was injected into the aforesaid system, and a first system containing $Cd_xZn_{1-x}Se$ alloy quantum dots was obtained after 20 seconds of reaction. Inject 1 mL of TBP solution into the first system, and continue the reaction for 60 min. In the reaction process, a certain amount of reaction solution was taken and injected into a quartz cuvette containing 1~2 mL of toluene for the ultraviolet-visible absorption spectroscopy and fluorescence spectroscopy.

Embodiment 13

Synthesis of $Cd_xZn_{1-x}Se$ alloy quantum dots: Weigh basic zinc carbonate (0.22 g, 0.4 mmol), oleic acid (1.4 g, 0.5 mmol) and 12 mL ODE to place in a 100 mL three-necked flask, vent the air with inert gas for 10 minutes and then raise the temperature to 280° C. to obtain a clarified solution (ie, a precursor containing a second Group II element). After cooling the clarified solution to 180'C, 1 mL of 0.5 mmol/ml, Se-ODE suspension was injected into it, and a system containing IT-VI semiconductor nanoclusters was formed after 10 minutes of reaction. Subsequently, 0.5 mL of 0.2 mmol/mL cadmium oleate solution (ie, a precursor containing a first Group II element) was injected into the aforesaid system, and a first system containing $Cd_xZn_{1-x}Se$ alloy quantum dots was obtained after 10 minutes of reaction. Inject 1 mL of TBP solution into the first system, raise the temperature to 200° C., and continue the reaction for 240 min.

Embodiment 14

Synthesis of $Cd_xZn_{1-x}Se$ alloy quantum dots: Weigh basic zinc carbonate (0.22 g, 0.4 mmol), oleic acid (1.4 g, 0.5 mmol) and 4 mL ODE to place in a 100 mL three-necked flask, vent the air with inert gas for 10 minutes and then raise the temperature to 280° C. to obtain zinc oleate solution for future use. Weigh cadmium oxide (CdO, 0.2 mmol, 0.0256 g), oleic acid (1.4 g, 0.5 mmol) and 10 mL ODE to place in a 100 mL three-necked flask, vent the air with inert gas for 10 minutes and then raise the temperature to 280° C. to obtain a clarified solution. After cooling the clarified solution to 180° C., 1 mL of 0.5 mmol/mL Se-TBP solution was injected into it, and a system containing II-VI semiconductor (CdSe) nanoclusters was formed after 10 minutes of reaction. Subsequently, 4 mL of the aforesaid zinc oleate solution (ie, a precursor containing a first Group II element) was injected into the aforesaid system, and a first system containing $Cd_xZn_{1-x}Se$ alloy quantum dots was obtained after 10 minutes of reaction. Inject 1 mL of TBP solution into the first system, raise the temperature to 310° C., and continue the reaction for 60 min.

Embodiment 15

Synthesis of $Cd_xZn_{1-x}Se$ alloy quantum dots: Weigh basic zinc carbonate (0.22 g, 0.4 mmol), oleic acid (1.4 g, 0.5 mmol) and 4 mL ODE to place in a 100 mL three-necked flask, vent the air with inert gas for 10 minutes and then raise the temperature to 280° C. to obtain zinc oleate solution for future use. Weigh cadmium oxide (CdO, 0.2 mmol, 0.0256 g), oleic acid (1.4 g, 0.5 mmol) and 10 mL ODE to place in a 100 mL three-necked flask, vent the air with inert gas for 10 minutes and then raise the temperature to 280° C. to obtain a clarified solution. After cooling the clarified solution to 180° C., 1 mL of 0.5 mmol/mL S-TBP solution was injected into it, and a system containing II-VI semiconductor (CdS) nanoclusters was formed after 10 minutes of reaction. Subsequently, 4 mL of the aforesaid zinc oleate solution (ie, a precursor containing a first Group II element) was injected into the aforesaid system, and a first system containing $Cd_xZn_{1-x}Se$ alloy quantum dots was obtained after 10 minutes of reaction. Inject 1 mL of TBP solution into the first system, raise the temperature to 310° C., and continue the reaction for 60 min.

Comparative Embodiment 1

Synthesis of $Cd_xZn_{1-x}Se$ alloy quantum dots: Weigh basic zinc carbonate (0.22 g, 0.4 mmol), oleic acid (1.4 g, 0.5 mmol), 10 mL ODE and 0.2 mmol/mL cadmium olcate solution to place in a 100 mL three-necked flask, vent the air with inert gas for 10 minutes and then raise the temperature to 280° C. to obtain a clarified solution. After heating the clarified solution to 300° C., 1 mL of 0.5 mmol/mL Se-ODE suspension was injected into it, then continue to react for 20 minutes. In the reaction process, a certain amount of reaction solution was taken and injected into a quartz cuvette containing 1~2 mL of toluene for the ultraviolet-visible absorption spectroscopy and fluorescence spectroscopy.

Comparative Embodiment 2

Synthesis of $Cd_xZn_{1-x}Se/ZnSe$ alloy quantum dots: Weigh basic zinc carbonate (0.33 g, 0.6 mmol), oleic acid (2.1 g, 0.75 mmol), 10 mL ODE and 0.2 mmol/mL cadmium oleate solution to place in a 100 mL three-necked flask, vent the air with inert gas for 10 minutes and then raise the temperature to 280° C. to obtain a clarified solution. After heating the clarified solution to 300° C., 1 mL of 0.5 mmol/mL Se-ODE suspension was injected into it, then continue to react for 20 minutes. Then, add 0.5 mL of 2 mmol/mL Se-TBP, and continue to react for 30 minutes, followed by subsequent addition of 0.5 mL of 2 mmol/mL Se-TBP, then continue to react for 30 minutes to obtain a product system. In the reaction process, a certain amount of reaction solution was taken and injected into a quartz cuvette containing 1~2 mL of toluene for the ultraviolet-visible absorption spectroscopy and fluorescence spectroscopy.

The purification method of the aforesaid Embodiments 1~15 and Comparative Embodiments 1~2: Take 5 ml liquid of the product system, put it in a centrifuge tube with a volume of 50 mL, add 5 mL of hexane, 8 mL of methanol and 40 mL of acetone, and then centrifuge it at 4000 RPM for 3 min. After stratification, discard the supernatant, and continue to wash with acetone three times. Finally, the precipitate was dissolved in a certain amount of ODE or toluene. Finally, the fluorescence spectra of the quantum dots of each of the embodiments and comparative embodiments were measured, and the quantum efficiency was tested with an integrating sphere. The measurement results are summarized in Table 1.

TABLE 1

|  | Fluorescence emission peak wavelength (nm) | Full width at half maximum(nm) |
|---|---|---|
| Embodiment 1 | 460 | 19 |
| Embodiment 2 | 462 | 19 |
| Embodiment 3 | 462 | 19 |
| Embodiment 4 | 467 | 18 |
| Embodiment 5 | 475 | 22 |
| Embodiment 6 | 468 | 20 |
| Embodiment 7 | 470 | 14 |
| Embodiment 8 | 475 | 20 |
| Embodiment 9 | 473 | 20 |
| Embodiment 10 | 450 | 15 |
| Embodiment 11 | 478 | 20 |
| Embodiment 12 | 462 | 20 |
| Embodiment 13 | 455 | 25 |
| Embodiment 14 | 465 | 26 |
| Embodiment 15 | 460 | 18 |
| Comparative Embodiment 1 | 485 | 45 |
| Comparative Embodiment 2 | 475 | 48 |

From the above description, it can be seen that the aforesaid embodiments of the present disclosure achieve the following technical effects:

This application uses the II-VI semiconductor nanoclusters formed in the early stage of nucleation as the substrate, and then adds the first Group II element precursor for cation exchange to form II-II-VI clusters. Based on this, the growth of II-II-VI alloy quantum dots is carried out. Compared with traditional II-VI quantum dots, the II-VI nanoclusters formed in the early stage of nucleation are in the intermediate state between nanocrystalline nucleation and nanocrystalline growth, and the size is very small. At this time, the precursor containing the first Group II element is added for cation exchange, causing that atoms of the first Group II element can easily enter the innermost of the II-VI clusters, forming alloy-like IT-II-VI nanoclusters, and then continue to grow. During the growth process, the atoms of the Group II element gradually diffuse outwardly to the entire particle, so that the size and morphology of the particle are gradually uniform, and the composition is gradually homogeneous, resulting in the obtainment of II-II-VI alloy quantum dots having a narrow full width at half maximum with homogeneous composition and more sufficient degree of alloying, and moreover, the self-nucleation phenomenon of II-VI quantum dots will not occur in the whole process.

The foregoing descriptions are merely preferred embodiments of the present disclosure and are not intended to limit the present disclosure, and for those skilled in the art, the present disclosure may have various changes and modifications. Any modification, equivalent replacement, and improvement made in the spirit and principle of the present disclosure shall fall within the protection scope of the present disclosure.

What is claimed is:

1. A preparation method of II-II-VI alloy quantum dot, wherein comprising
    step S1: reacting a precursor containing a second Group II element and a precursor containing a first Group VI element to form a II-VI semiconductor nanocluster;
    step S2: mixing said II-VI semiconductor nanocluster with a precursor containing a first Group II element, and performing cation exchange and in-situ growth to obtain a first system containing the II-II-VI alloy quantum dot;
    step S3: mixing a precursor containing a second Group VI element with said first system, and heating to obtain a second system containing the II-II-VI alloy quantum dot with a II-VI shell.

2. The preparation method in accordance with claim 1, wherein a size of said II-VI semiconductor nanocluster is 1 nm or less.

3. The preparation method in accordance with claim 1, wherein said II-VI semiconductor nanocluster is one of ZnSe nanocluster, ZnS nanocluster, CdSe nanocluster and CdS nanocluster.

4. The preparation method in accordance with claim 1, wherein a reaction temperature range of said step S1 is 150~310° C.

5. The preparation method in accordance with claim 1, wherein a precursor of said first Group VI element is a selenium precursor.

6. The preparation method in accordance with claim 5, wherein said selenium precursor is one of a Se-ODE suspension, a Se-ODE solution, and an alkylphosphine selenium.

7. The preparation method in accordance with claim 1, wherein a precursor of said second Group II element is a carboxylate.

8. The preparation method in accordance with claim 1, wherein a precursor of said first Group II element is a carboxylate.

9. The preparation method in accordance with claim 1, wherein changing a molar ratio of said second Group II element, said Group VI element and said first Group II element to change a fluorescence emission peak wavelength and a size of said II-II-VI alloy quantum dot.

10. The preparation method in accordance with claim 1, wherein said step S2 comprising:
mixing said II-VI semiconductor nanocluster with said precursor containing said first Group II element and an organic phosphine, and heating to perform cation exchange and in-situ growth for obtaining the II-II-VI alloy quantum dot.

11. The preparation method in accordance with claim 10, wherein said organic phosphine is an alkylphosphine.

12. The preparation method in accordance with claim 1, wherein in said step S2, a temperature range of said in-situ growth reaction is 200~310° C.

13. The preparation method in accordance with claim 1, wherein a temperature after heating in said step S3 is 250 to 320° C., and a molar ratio of said first Group II element with respect to said first Group VI element in said step S2 is less than or equal to 1.5:1, and a fluorescence emission peak wavelength of the obtained II-II-VI alloy quantum dot with said II-VI shell is 420~480 nm.

14. The preparation method in accordance with claim 1, wherein said preparation method further comprising step S4: coating said II-II-VI alloy quantum dot with said II-VI shell to obtain a multi-shell coated II-II-VI alloy quantum dot.

15. A II-II-VI alloy quantum dot, wherein a full width at half maximum of said II-II-VI alloy quantum dot is between 14 and 22 nm, and said II-II-VI alloy quantum dot is CdZnSe alloy quantum dot; said II-II-VI alloy quantum dot has a II-VI shell.

16. The II-II-VI alloy quantum dot in accordance with claim 15, wherein said II-II-VI alloy quantum dot with said II-VI shell is CdZnSe/ZnSe alloy quantum dot.

17. The II-II-VI alloy quantum dot in accordance with claim 16, wherein said II-II-VI alloy quantum dot with said II-VI shell is a multi-shell coated alloy quantum dot, and a quantum yield of said multi-shell coated alloy quantum dot is greater than or equal to 90%.

18. The II-II-VI alloy quantum dot in accordance with claim 15, wherein said II-II-VI alloy quantum dot is prepared by said preparation method in accordance with claim 1.

19. A device, said device being one of an optical device and an optoelectronic device, said device comprising a II-II-VI alloy quantum dot, wherein said II-II-VI alloy quantum dot is said II-II-VI alloy quantum dot in accordance with claim 15.

20. A quantum dot composition, comprising a II-II-VI alloy quantum dot, wherein said II-II-VI alloy quantum dot is said II-II-VI alloy quantum dot in accordance with claim 15.

* * * * *